US012317661B2

(12) United States Patent
Abe et al.

(10) Patent No.: US 12,317,661 B2
(45) Date of Patent: May 27, 2025

(54) LIGHT EMITTING MODULE MANUFACTURING METHOD INCLUDING COVERING LATERAL FACES OF LIGHT EMITTING ELEMENTS WITH RESIN

(71) Applicant: NICHIA CORPORATION, Anan (JP)

(72) Inventors: Koji Abe, Tokushima (JP); Kazusa Nishiuchi, Anan (JP)

(73) Assignee: NICHIA CORPORATION, Anan (JP)

( * ) Notice: Subject to any disclaimer, the term of this patent is extended or adjusted under 35 U.S.C. 154(b) by 456 days.

(21) Appl. No.: 17/702,245

(22) Filed: Mar. 23, 2022

(65) Prior Publication Data
US 2022/0328741 A1    Oct. 13, 2022

(30) Foreign Application Priority Data

Mar. 31, 2021 (JP) .................................. 2021-060799
Feb. 3, 2022 (JP) .................................. 2022-015422

(51) Int. Cl.
*H10H 20/857* (2025.01)
*H01L 25/075* (2006.01)
*H10H 20/01* (2025.01)
*H10H 20/854* (2025.01)
*H10H 20/856* (2025.01)

(52) U.S. Cl.
CPC ....... *H10H 20/857* (2025.01); *H01L 25/0753* (2013.01); *H10H 20/01* (2025.01); *H10H 20/854* (2025.01); *H10H 20/856* (2025.01); *H10H 20/0362* (2025.01); *H10H 20/0364* (2025.01)

(58) Field of Classification Search
CPC ... H01L 33/62; H01L 25/0753; H01L 33/005;
H01L 33/56; H01L 33/60; H01L 2933/005; H01L 2933/0066; H01L 33/505; H01L 33/54; H01L 33/50; H01L 2933/0041; H01L 2933/0058; H10H 20/857; H10H 20/01; H10H 20/854; H10H 20/856; H10H 20/0362; H10H 20/0364; H10H 29/41; H10H 29/8321; H10F 77/939; H10F 77/331; A61K 40/405; A01N 1/146; H10D 30/6215; H10D 62/054; H10D 30/64
USPC .......................................................... 438/28
See application file for complete search history.

(56) References Cited

U.S. PATENT DOCUMENTS 6,117,706 A * 9/2000 Yoshioka ............. H05K 3/0035
                                                        438/106
6,565,920 B1    5/2003 Endisch
(Continued)

FOREIGN PATENT DOCUMENTS

DE    10 2013 100 063 A1    7/2013
JP         H06-143139 A     5/1994
(Continued)

*Primary Examiner* — Duy T Nguyen
(74) *Attorney, Agent, or Firm* — Foley & Lardner LLP

(57) ABSTRACT

A method of manufacturing a light emitting module includes: providing a wiring board having an upper face on which a plurality of light emitting elements are mounted; disposing a first resin in an area of the upper face of the wiring board that is outward of a region in which the light emitting elements are mounted, wherein the first resin contains a light reflecting substance; and covering lateral faces of the light emitting elements with the first resin by spreading the first resin over the region in which the light emitting elements are mounted.

10 Claims, 11 Drawing Sheets

(56) References Cited

U.S. PATENT DOCUMENTS

| | | |
|---|---|---|
| 6,610,168 B1 | 8/2003 | Miki et al. |
| 2010/0052189 A1 | 3/2010 | Sakurai et al. |
| 2011/0309388 A1 | 12/2011 | Ito et al. |
| 2012/0320581 A1* | 12/2012 | Rogers ............... F21V 29/70 257/E33.059 |
| 2013/0175554 A1 | 7/2013 | Han et al. |
| 2013/0334539 A1 | 12/2013 | Kojima et al. |
| 2014/0001656 A1 | 1/2014 | Ebe et al. |
| 2014/0186980 A1* | 7/2014 | Igarashi ............... H01L 33/52 438/26 |
| 2014/0191272 A1 | 7/2014 | Jerebic et al. |
| 2014/0217437 A1* | 8/2014 | Kim ............... H01L 33/505 438/27 |
| 2015/0024516 A1* | 1/2015 | Seibel ............ H01L 33/0095 118/712 |
| 2016/0095184 A1 | 3/2016 | Nakabayashi et al. |
| 2017/0054064 A1 | 2/2017 | Shichijo et al. |
| 2017/0288086 A1* | 10/2017 | Choi ............... H01L 22/12 |
| 2018/0358339 A1 | 12/2018 | Iguchi |
| 2019/0165218 A1 | 5/2019 | Nakai et al. |
| 2020/0161498 A1 | 5/2020 | Ikeda et al. |

FOREIGN PATENT DOCUMENTS

| | | | |
|---|---|---|---|
| JP | 2003-535483 A | | 11/2003 |
| JP | 2006-191022 A | | 7/2006 |
| JP | 2008-140834 A | | 6/2008 |
| JP | 2009-182028 A | | 8/2009 |
| JP | 2012-039155 A | | 2/2012 |
| JP | 2012-156180 A | | 8/2012 |
| JP | 2012-195345 A | | 10/2012 |
| JP | 2014-127594 A | | 7/2014 |
| JP | 2015-216297 A | | 12/2015 |
| JP | 2016-072379 A | | 5/2016 |
| JP | 2016-072435 A | | 5/2016 |
| JP | 2017-041477 A | | 2/2017 |
| JP | 2017-073439 A | | 4/2017 |
| JP | 2017-076673 A | | 4/2017 |
| JP | 2017-196752 A | | 11/2017 |
| JP | 2019-102614 A | | 6/2019 |
| JP | 2020-074005 A | | 5/2020 |
| JP | 2020-088381 A | | 6/2020 |
| KR | 20110125991 | * | 11/2011 |
| WO | WO-2020003789 A1 | * | 1/2020 ........... H01L 33/005 |

* cited by examiner

LIGHT EMITTING MODULE MANUFACTURING METHOD INCLUDING COVERING LATERAL FACES OF LIGHT EMITTING ELEMENTS WITH RESIN

CROSS-REFERENCE TO RELATED APPLICATION

This application claims priority to Japanese Patent Application No. 2021-060799, filed on Mar. 31, 2021, and Japanese Patent Application No. 2022-015422, filed on Feb. 3, 2022. The disclosures of these applications are hereby incorporated by reference in their entireties.

BACKGROUND

The present disclosure relates to a light emitting module and a method of manufacturing such a light emitting module.

In recent years, a light emitting module has been proposed in which a large number of light emitting elements mounted on a single wiring board are individually controlled (see for example, Japanese Patent Publication No. 2020-74005). There is a need to improve the efficiency in extracting light from each light emitting element in such a light emitting module.

SUMMARY

One object of certain embodiments of the present disclosure is to provide a light emitting module having high light extraction efficiency, and a method of manufacturing such a light emitting module.

A method of manufacturing a light emitting module according to an embodiment includes: providing a wiring board having an upper face on which a plurality of light emitting elements are mounted; disposing a first resin in an area of the upper face of the wiring board and outward from a region in which the light emitting elements are mounted, wherein the first resin contains a light reflecting substance; and covering a lateral face of the light emitting elements with the first resin by spreading the first resin over the region.

A light emitting module according to an embodiment includes a wiring board, a plurality of light emitting elements mounted on the wiring board, a first resin containing a light reflecting substance, and a second resin containing a phosphor. At least one of the light emitting elements has an upper face, a lower face positioned opposite to the upper face, and oblique lateral faces between the upper face and the lower face spreading apart from the lower face to the upper face. The lower face of at least one of the light emitting elements faces the upper face of the wiring board. The first resin is disposed between an upper face of the wiring board and the lower face of the light emitting elements, and between the lateral faces of adjacent ones of the light emitting elements. The second resin covers the upper face of at least one of the light emitting elements and the upper face of the first resin. Between adjacent ones of the light emitting elements, the upper face of the first resin is positioned between the upper faces and the lower faces of the adjacent ones of the light emitting elements in a direction in which the wiring board faces the second resin. The portions of the lateral faces of the adjacent ones of the light emitting elements that are exposed from the first resin are covered by the second resin.

According to certain embodiments of the present disclosure, a light emitting module having high light extraction efficiency and a method of manufacturing such a light emitting module can be achieved.

DETAILED DESCRIPTION

Figure 1:
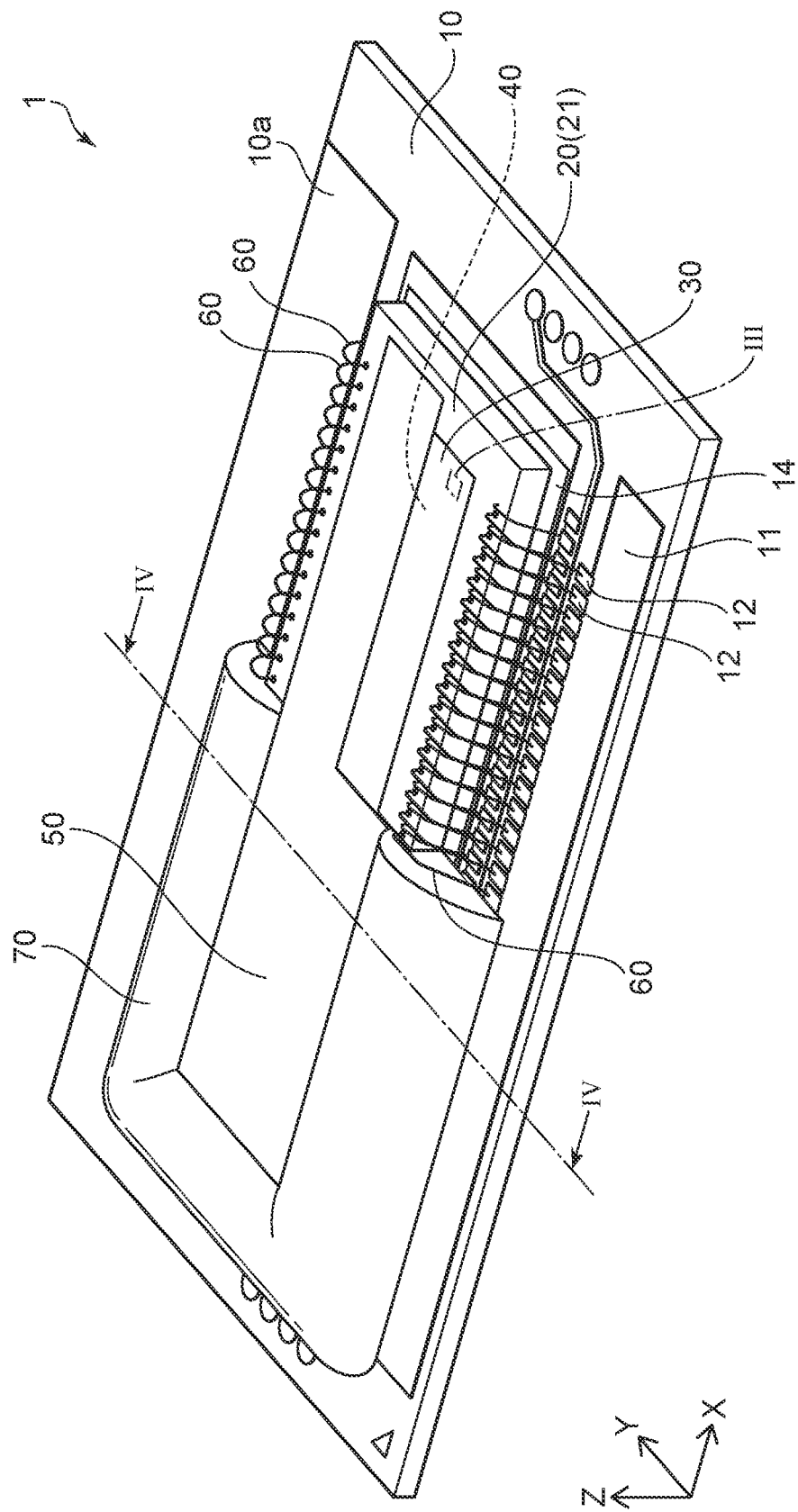
FIG. 1 is a perspective view of a light emitting module according to an embodiment when viewed diagonally from above.

Certain embodiments will be explained below with reference to the accompanying drawings. Each drawing is a schematic view of an embodiment. As such, the sizes of and spacing or positional relationships between the members may be exaggerated or certain parts omitted. An end face view which only shows a cross section might be used as a cross-sectional view. In the drawings, the same constituents will be denoted by the same reference numerals.

Construction

First, the construction of a light emitting module according to one embodiment will be explained.

FIG. 1 is a perspective view of a light emitting module according to the embodiment when viewed diagonally from above.

Figure 2:
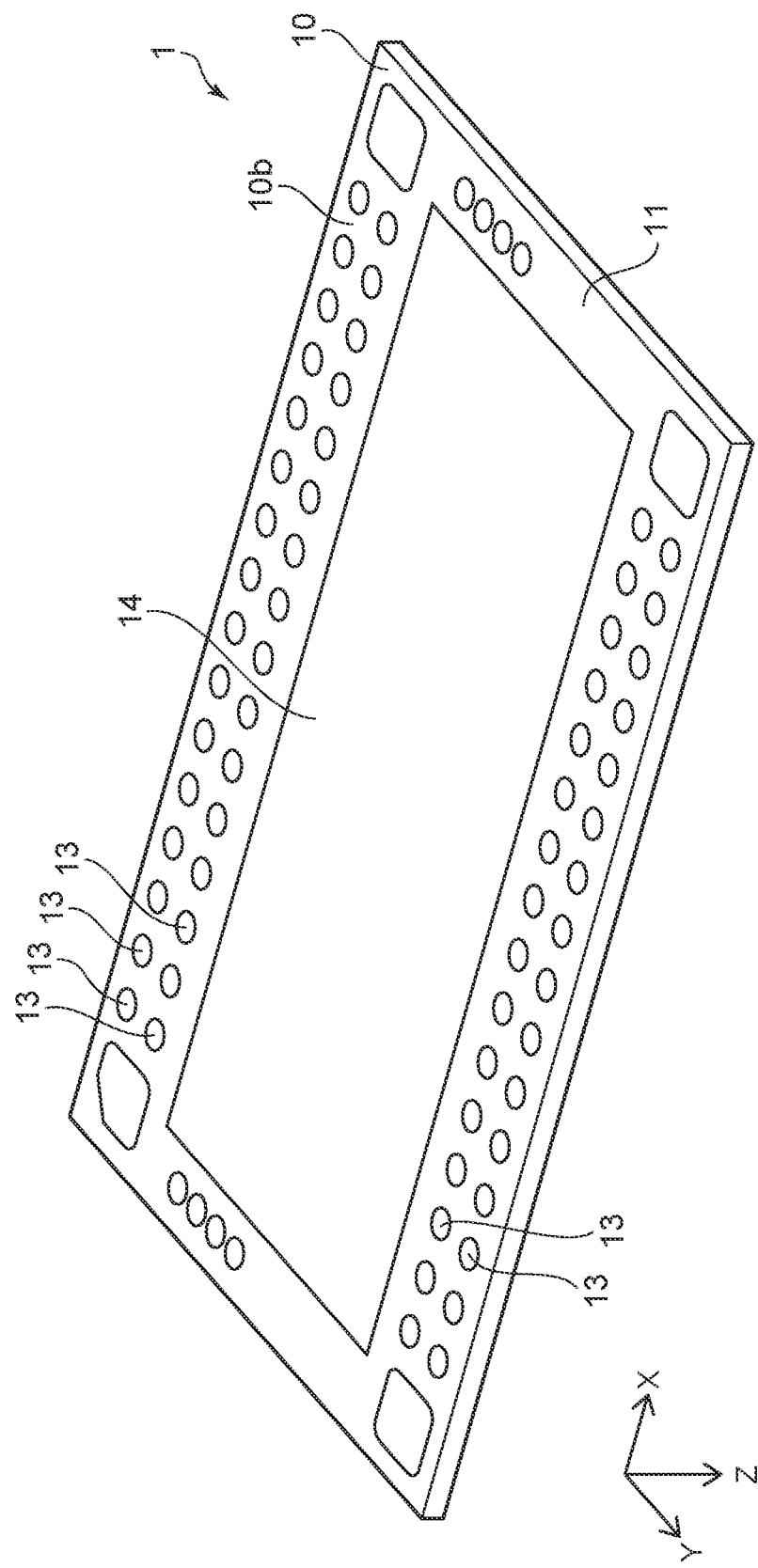
FIG. 2 is a perspective view of the light emitting module according to the embodiment when viewed diagonally from below.

FIG. 2 is a perspective view of the light emitting module according to the embodiment when viewed diagonally from below.

Figure 3:
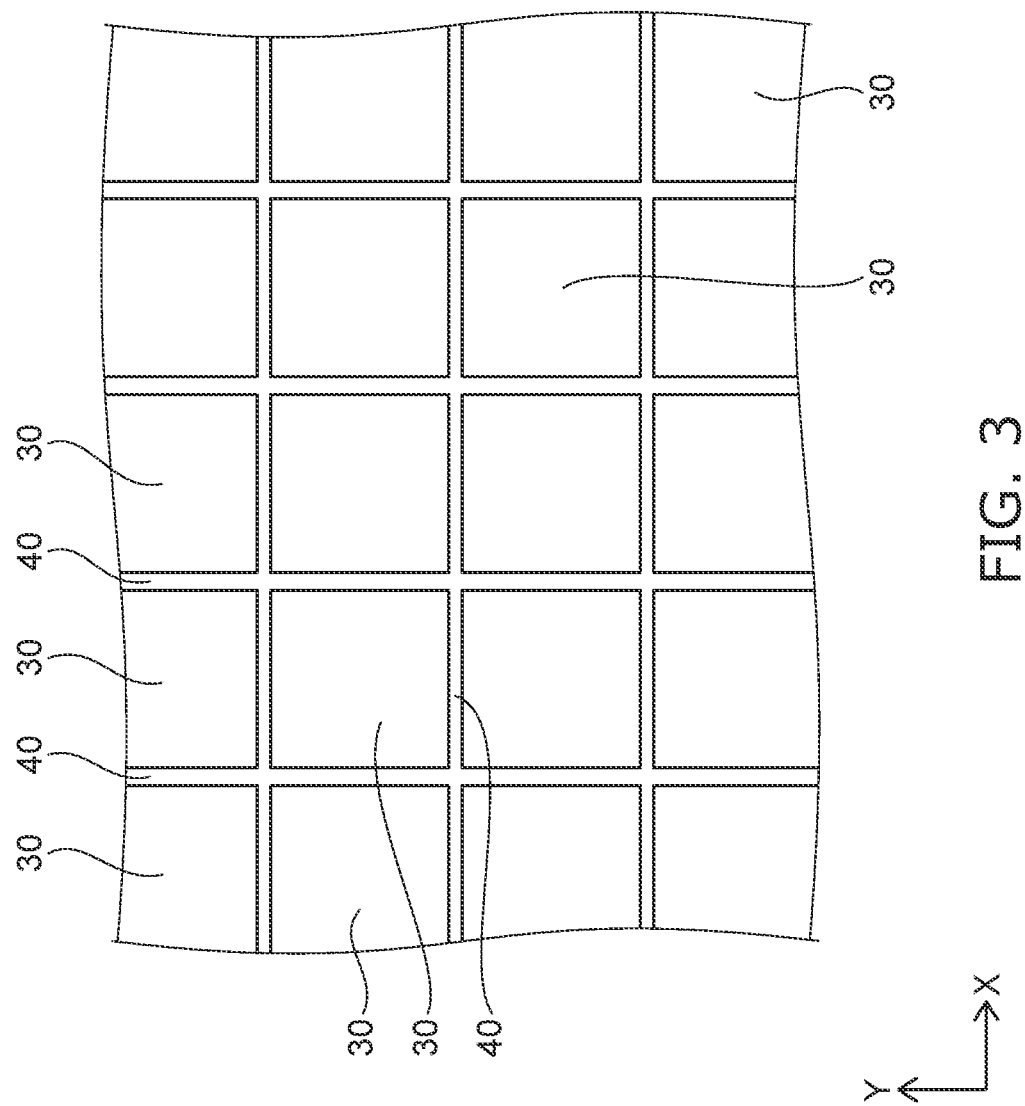
FIG. 3 is an enlarged plan view of the region III in FIG. 1.

FIG. 3 is an enlarged plan view of the region III in FIG. 1.

Figure 4:
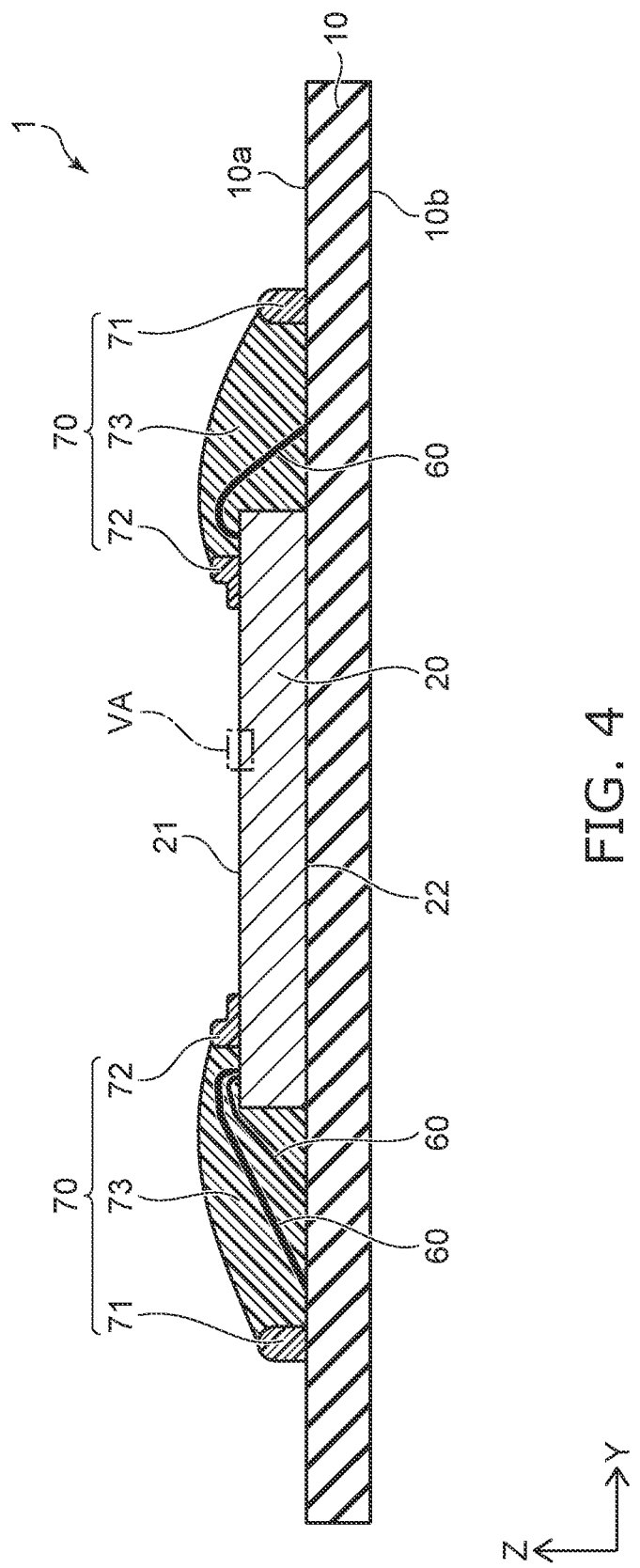
FIG. 4 is a cross-sectional view taken along line IV-IV in FIG. 1.

FIG. 4 is a cross-sectional view taken along line IV-IV in FIG. 1.

Figure 5A:
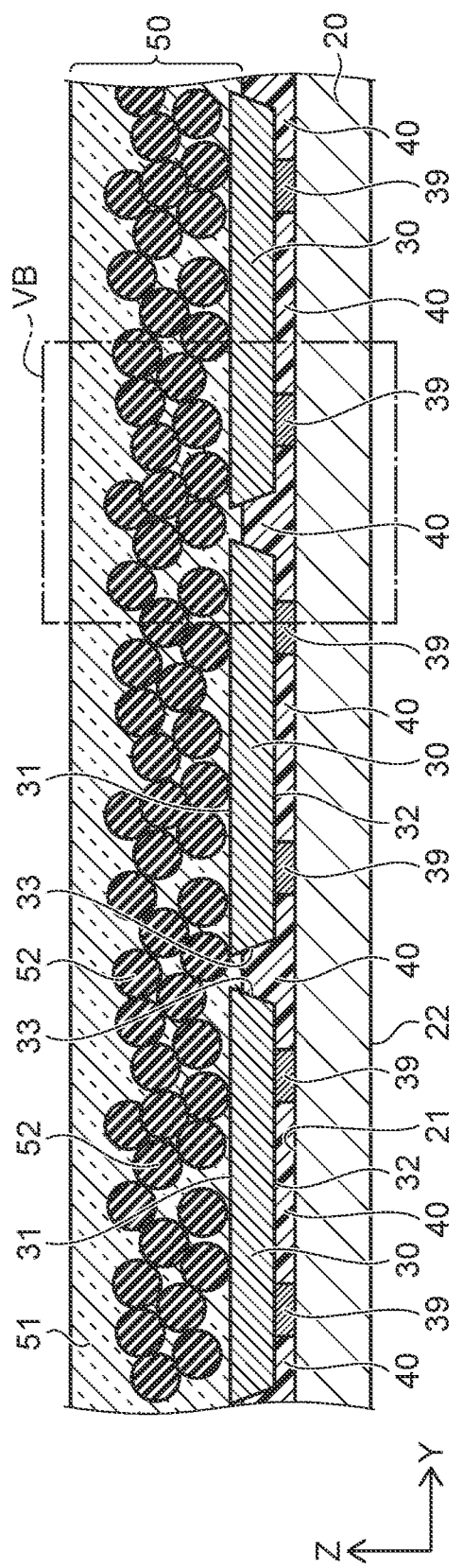
FIG. 5A is an enlarged cross-sectional view of the region VA in FIG. 4.

FIG. 5A is an enlarged cross-sectional view of the region VA in FIG. 4.

Figure 5B:
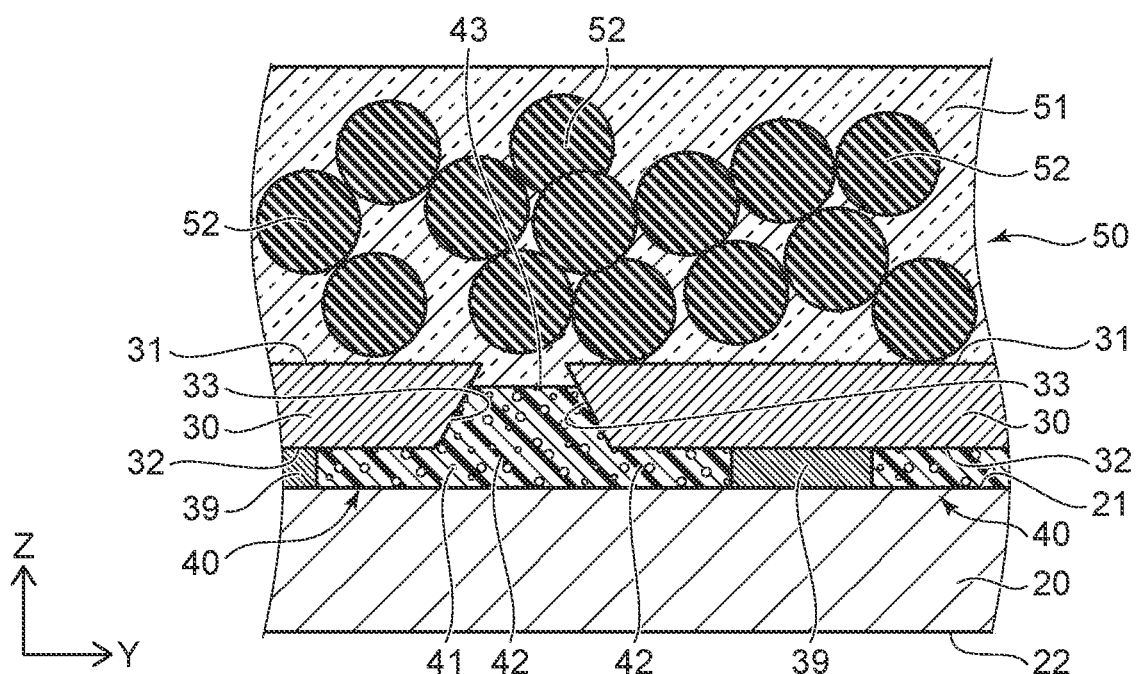
FIG. 5B is an enlarged cross-sectional view of the region VB in FIG. 5A.

FIG. 5B is an enlarged cross-sectional view of the region VB in FIG. 5A.

As shown in FIG. 1 and FIG. 2, the light emitting module 1 according to this embodiment includes a package substrate 10, a wiring board 20, a plurality of light emitting elements 30, a first resin 40, a second resin 50, a plurality of wires 60, and a third resin 70. In FIG. 1, for explanation purposes, a portion of the third resin 70 and a portion of the second resin 50 are omitted to make some of the wires 60, some of the light emitting elements 30, and the like visible.

The light emitting module 1 includes a large number of small-sized light emitting elements 30 as the light emitting elements 30, and preferably includes even larger number of small-sized light emitting elements 30 densely arranged with a narrow pitch on the wiring board 20. This can increase the number of divided emission ranges to be individually controlled to allow the light emitting module to be used as a light source for a high resolution lighting system. When used as an adaptive driving beam (ADB) headlight, for example, the light emitting module 1 can achieve higher definition and higher resolution emission by way of an advanced light distribution control.

A package substrate 10 includes, for example, a flat sheet shaped base 11 and wiring provided at least on the upper face of the base 11. The material used for the base 11 preferably has high heat dissipation performance, more preferably further has a high light-shielding property and high strength. Specific examples include metals, such as aluminum (Al) and copper (Cu), ceramics, such as alumina, aluminum nitride, and mullite, resins, such as phenol resins, epoxy resins, polyimide resin, bismaleimide triazine (BT) resins and polyphthalamide (PPA) resin, and metal composite materials, and resin and ceramic composite materials. The package substrate 10 may be flat sheet shaped, or of a structure having a cavity in the upper face for placing a wiring board 20. Examples of wiring materials include metals, such as copper (Cu), silver (Ag), gold (Au), aluminum (Al), platinum (Pt), titanium (Ti), tungsten (W), palladium (Pd), iron (Fe), and nickel (Ni), or their alloys.

As one example, the package substrate 10 is formed by stacking an insulation material, such as an epoxy resin, on a base formed of a metal, such as Al or Cu, in which wiring is provided on the surface and the interior. Portions of the wiring constitute a plurality of upper face pads 12 on the upper face 10a of the package substrate 10, and other portions of the wiring constitute a plurality of lower face pads 13 on the lower face 10b of the package substrate 10.

In the present specification, an XYZ orthogonal coordinate system is employed for explanation purposes. The longitudinal direction of the package substrate 10 is the "X direction," the transverse direction is the "Y direction," and the thickness direction is the "Z direction." The Z direction from the lower face 10b to the upper face 10a of the package substrate 10 might also be referred to as "upward" and the reverse direction as "downward," but these expressions are also used as a matter of convenience and have nothing to do with the direction of gravity.

The metal base is at least partially exposed from the insulating material on both the upper face 10a and the lower face 10b of the package substrate 10, constituting a heat dissipation part 14. In a plan view, the heat dissipation part 14 is positioned in the central portion of the package substrate 10, and a plurality of upper face pads 12 and a plurality of lower face pads 13 are arranged on both sides of the heat dissipation part 14 so as to interpose the heat dissipation part 14. The upper face pads 12 and the lower face pads 13 are arranged, for example, along the longer sides of the package substrate 10.

A wiring board 20 is disposed on the heat dissipation part 14 of the package substrate 10. The wiring board 20 is, for example, a silicon board in which an integrated circuit is embedded, such as an application specific integrated circuit (ASIC) board. The lower face of the wiring board 20 is bonded to the upper face of the heat dissipation part 14 via a bonding material. An example of the bonding material is silicone silver paste. The central portion of the upper face 21 of the wiring board 20 is provided with a first pad as a region 38 on and to which the light emitting elements 30 are mounted and connected. A second pad is disposed in the periphery of and electrically connected to the first pad.

Wires 60 are members for electrically connecting the package substrate 10 and the wiring board 20. The wires 60 are connected to the upper face pads 12 of the package substrate 10 and the second pad of the wiring board 20. For example, the wires 60 are formed of gold (Au). For example, as many wires 60 as the upper face pads 12 are provided.

As shown in FIG. 1 and FIG. 3 to FIG. 5B, the light emitting elements 30 are mounted in the central portion of the upper face 21 of the wiring board 20. The light emitting elements 30 are substantially quadrangular when viewed from above. The light emitting elements 30 are arranged in a matrix, for example. In one example, light emitting elements 30 each having substantially a square upper face are arranged in four segments, 64 rows by 64 columns per segment, 16,384 pieces in total. In one example, the light emitting elements 30 are arranged per 50 μm, and each light emitting element 30 has substantially square shape whose each side is 45 μm. Accordingly, the space between adjacent light emitting elements 30 is 5 μm. The light emitting elements 30 are connected to the first pad on the upper face 21 of the wiring board 20. The light emitting elements 30 are, for example, light emitting diodes (LEDs), and emit blue light, for example.

The shape and the size of each light emitting element 30 in the light emitting module 1 are preferably substantially quadrangular and 20 μm to 100 μm per side, more preferably substantially quadrangular and 30 μm to 100 μm per side, in a top view, considering the mounting accuracy of the light emitting elements 30 and the high definition quality of the module. The number of light emitting elements 30 in the light emitting module 1 is preferably 5,000 to 100,000, more preferably 15,000 to 30,000, considering the size reduction and the high definition quality of the light emitting module.

The distance between adjacent light emitting elements 30 is preferably narrower in order to enhance the high definition quality of the light emitting module 1. Considering the efficiency in disposing the first resin 40 described later, moreover, the distance between adjacent light emitting elements 30 is preferably set in a range of 2 μm to 10 μm, more preferably 3 μm to 7 μm.

For the light emitting elements 30, those emitting light of any wavelength can be selected. For example, for blue or green light emitting elements, those using ZnSe, nitride semiconductors ($In_XAl_YGa_{1-X-Y}N$ ($0 \leq X$, $0 \leq Y$, $X+Y \leq 1$)), or GaP can be selected. For red light emitting elements 30, semiconductors expressed as GaAlAs or AlInGaP can be suitably used. Furthermore, semiconductor light emitting elements formed of materials other than these can also be used. The composition or emission color of the light emitting elements 30 to be employed can be suitably selected in accordance with the purpose.

As shown in FIG. 5A, the light emitting elements 30 each have an upper face 31, a lower face 32 that opposes the upper face 31, and lateral faces 33 between the upper face 31 and the lower face 32. The lateral faces 33 are oblique so as to spread from the lower face 32 to the upper face 31. The upper face 31 and the lower face 32 of each light emitting element 30 are quadrangular in a plan view, for example. The four lateral faces are contiguous with the upper face 31 and the lower face 32. In other words, the shape of each light emitting element 30 is substantially an inverted truncated square pyramid. The lower face 32 of each light emitting element 30 opposes the upper face 21 of the wiring board 20. Each light emitting element 30 is connected to the first pad via a conductive bonding material 39. For this reason, the lower face 32 of each light emitting element 30 is distant from the upper face 21 of the wiring board 20. An example of the bonding material 39 is copper (Cu). The bonding material 39 can be applied by electroplating, for example.

A first resin 40 has light reflecting property and is disposed between the upper face 21 of the wiring board 20 and the lower faces 32 of the light emitting elements 30, and between the facing lateral faces 33 of adjacent light emitting elements 30. In other words, the first resin 40 is disposed such that the upper faces of the light emitting elements 30 are exposed while covering the lower portions of the lateral faces 33 and the lower faces 32 of the light emitting elements. This can extract more light from the light emitting elements 30 through the upper face 21. The first resin 40 includes a base material 41 formed of a light transmissive resin and a light reflecting substance 42 contained in the base material 41. Increasing the amount of the light reflecting substance 42 contained in the first resin 40 can increase the efficiency in extracting the light from the light emitting elements 30. The concentration of the light reflecting substance 42 in the first resin 40 is preferably in a range of 50% to 70% by mass, and is set for example, as about 60% by mass.

For the light transmissive resin for the base material 41, for example, a silicone resin, modified silicone resin, epoxy resin, modified epoxy resin, acrylic resin, or a hybrid resin containing at least one of these resins can be used. Among them, the use of a silicone resin which is highly heat resistant and light resistant is preferable, a dimethyl silicone resin is more preferable. Dimethyl silicon resins are highly reliable as they are resistant to high temperature or the like, which are suited in automotive applications.

For the light reflecting substance, for example, titanium oxide, aluminum oxide, zinc oxide, barium carbonate, barium sulfate, boron nitride, aluminum nitride, glass filler, or the like can be suitably used.

In one example, the base material 41 is a dimethyl silicone resin, and the light reflecting substance is titanium oxide. The first resin 40 is white in appearance.

A second resin 50 has light transmissivity and covers the upper faces 31 of the light emitting elements 30 and the upper face 43 of the first resin 40. The second resin 50 is in contact with the upper faces 31 and the upper portions of the lateral faces 33 of the light emitting elements 30, and the upper face 43 of the first resin 40. The upper portions and the lower portions of the lateral faces 33 refer to, for example, the regions of the lateral faces 33 on the upper face side and the lower face side, respectively, in the height direction from the lower faces 32 to the upper faces 32. The second resin 50 contains at least a base material 51 formed of a light transmissive resin, and may contain a phosphor 52 contained in the base material 51.

For the base material 51, the same or a similar material to that for the base material 41 of the first resin 40 described above can be used. For the phosphor 52, for example, yttrium aluminum garnet based phosphors (e.g., $Y_3(Al,Ga)_5O_{12}$:Ce), lutetium aluminum garnet based phosphors (e.g., $Lu_3(Al,Ga)_5O_{12}$:Ce), terbium aluminum garnet based phosphors (e.g., $Tb_3(Al,Ga)_5O_{12}$:Ce), CCA-based phosphors (e.g., $Ca_{10}(PO_4)_6Cl_2$:Eu), SAE-based phosphors (e.g., $Sr_4Al_{14}O_{25}$:Eu), chlorosilicate based phosphors (e.g., $Ca_8MgSi_4O_{16}Cl_2$:Eu), nitride based phosphors, such as β-SiAlON based phosphors (e.g., $(Si,Al)_3(O,N)_4$:Eu), α-SiAlON based phosphors (e.g., $Ca(Si,Al)_{12}(O,N)_{16}$:Eu), SLA based phosphors (e.g., $SrLiAl_3N_4$:Eu), CASN-based phosphors (e.g., $CaAlSiN_3$:Eu), or SCASN-based phosphors (e.g., $(Sr,Ca)AlSiN_3$:Eu), fluoride based phosphors, such as KSF-based phosphors (e.g., $K_2SiF_6$:Mn), KSAF-based phosphors (e.g., $K_2(Si,Al)F_6$:Mn), or MGF-based phosphors (e.g., $3.5MgO \cdot 0.5MgF_2 \cdot GeO_2$:Mn), phosphors having a Perovskite structure (e.g., $CsPb(F,Cl,Br,I)_3$), or quantum dot phosphors (e.g., CdSe, InP, $AgInS_2$ or $AgInSe_2$) can be used.

As shown in FIG. 5B, between adjacent light emitting elements 30, the upper face 43 of the first resin 40 is positioned between the upper faces 31 and the lower faces 32 of the light emitting elements 30 in the Z direction, i.e., in the direction in which the wiring board 20 faces the second resin 50. In this manner, the lower portions and the upper portions of the lateral faces 33 of the light emitting elements 30 are covered by the first resin 40 and the second resin 50, respectively. In other words, the light emitting module 1 has recessed parts between adjacent light emitting elements 30, the recessed parts being defined by the lateral faces 33 of the light emitting elements 30 and the upper face 43 of the first resin 40, and the second resin 50 is disposed in the recessed parts.

A third resin 70 protects the wires that connect the package substrate 10 and the wiring board 20.

The plan view shape of the third resin 70 is a quadrangular frame formed along the outline of the wiring board 20. The third resin 70 is disposed to extend from the upper face of the package substrate 10 to the upper face of the wiring board 20 to cover the upper face pads 12 of the package substrate 10, the wires 60, and the external connection pads of the wiring board 20.

As shown in FIG. 4, the third resin 70 includes an outer resin frame 71 disposed on the package substrate 10, an inner resin frame 72 disposed on the wiring board 20, and a protective resin 73 disposed between the outer resin frame 71 and the inner resin frame 72. The third resin 70 may have light transmissivity or light shielding property. The third resin 70 includes at least a base material formed of a light transmissive resin, and may contain a light reflecting substance and/or a light absorbing substance. For the base material, the same or a similar material to that for the base material 41 of the first resin 40 described above can be used. For the light reflecting substance, the same or a similar material to that for the light reflecting substance in the first resin 40 described above can be used. Examples of the light absorbing substance include carbon black, graphite, and the like.

In one example, the outer resin frame 71 and the inner resin frame 72 have light transmissivity, while the protective resin 73 has light reflecting property (light shielding property). The protective resin 73 appears, for example, white, black, or gray.

The first resin 40, the second resin 50, and the third resin 70 may each contain a coloring agent, diffuser, viscosity adjusting filler, or the like as needed.

Manufacturing Method

Next, a method of manufacturing a light emitting module 1 according to an embodiment will be explained.

FIG. 6A to FIG. 6C and FIG. 7A to FIG. 7C are cross-sectional views showing a method of manufacturing a light emitting module according to the embodiment.

Figure 8A:
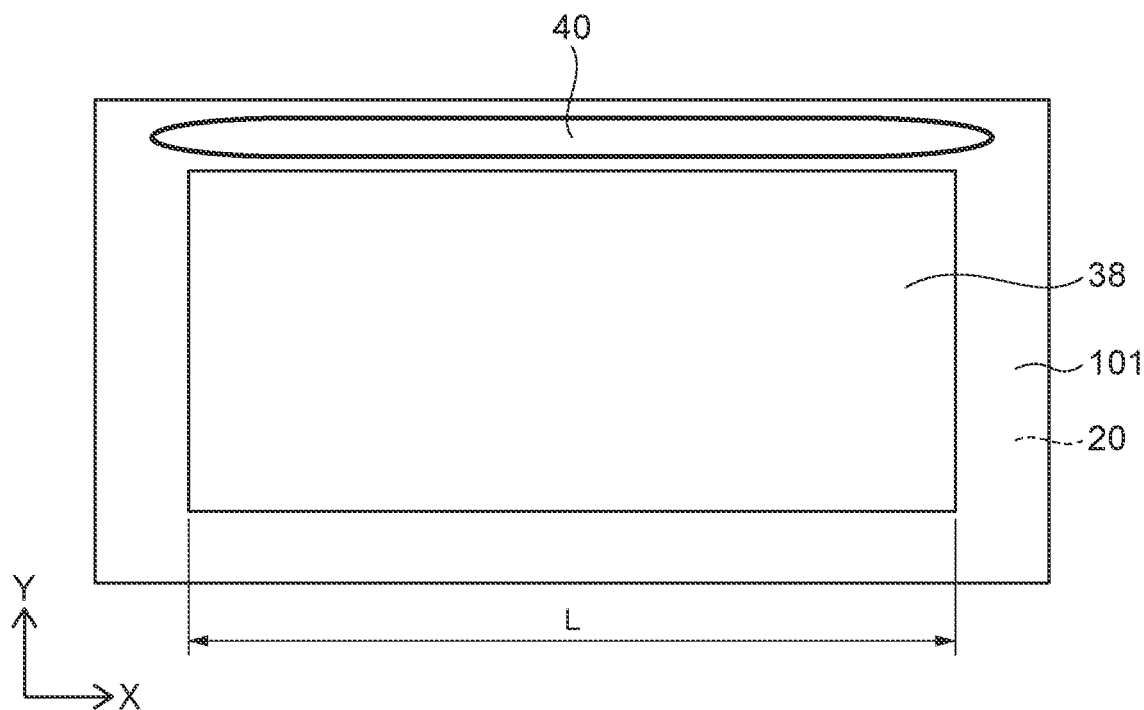
FIG. 8A is a plan view showing the method of manufacturing a light emitting module according to the embodiment.
Figure 8B:
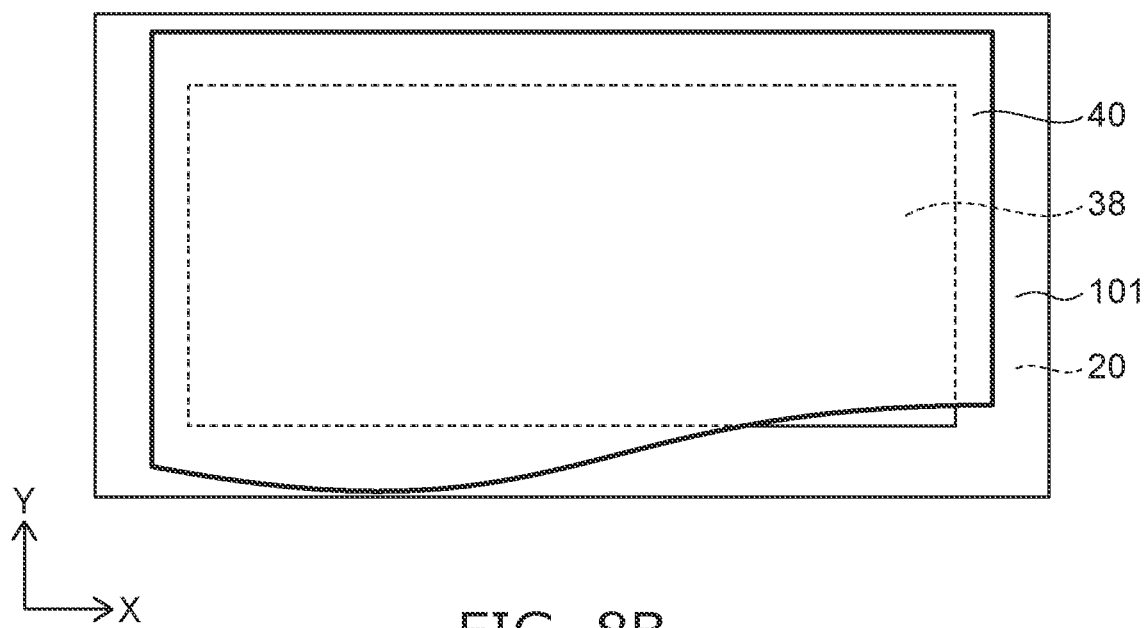
FIG. 8B is a plan view showing the method of manufacturing a light emitting module according to the embodiment.

FIG. 8A and FIG. 8B are plan views showing the method of manufacturing a light emitting module of the embodiment.

Figure 9:
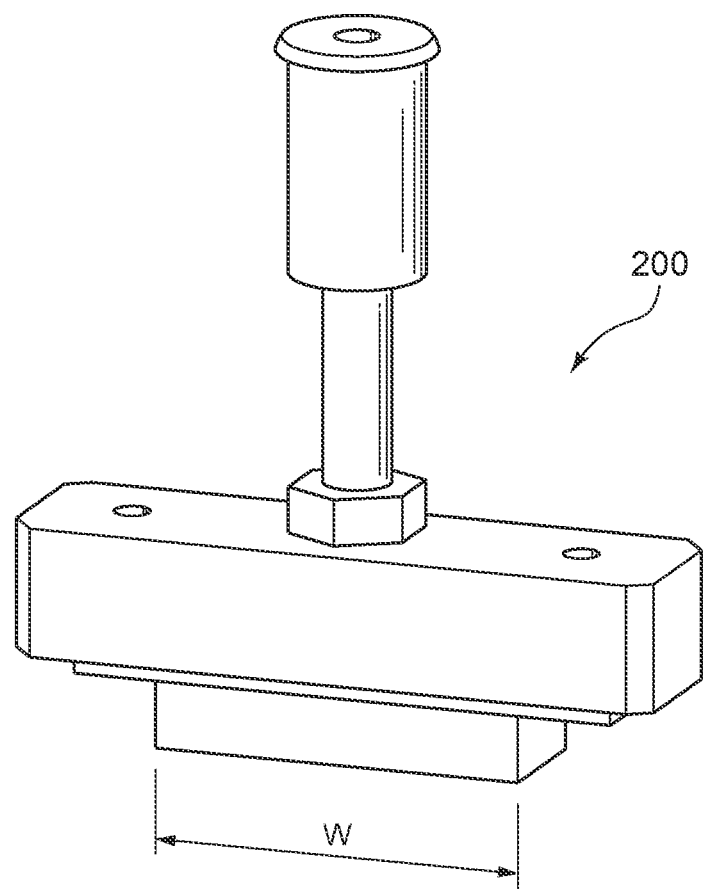
FIG. 9 is a perspective view of a nozzle used in the embodiment.

FIG. 9 is a perspective view of a nozzle used in the embodiment.

Figure 10A:
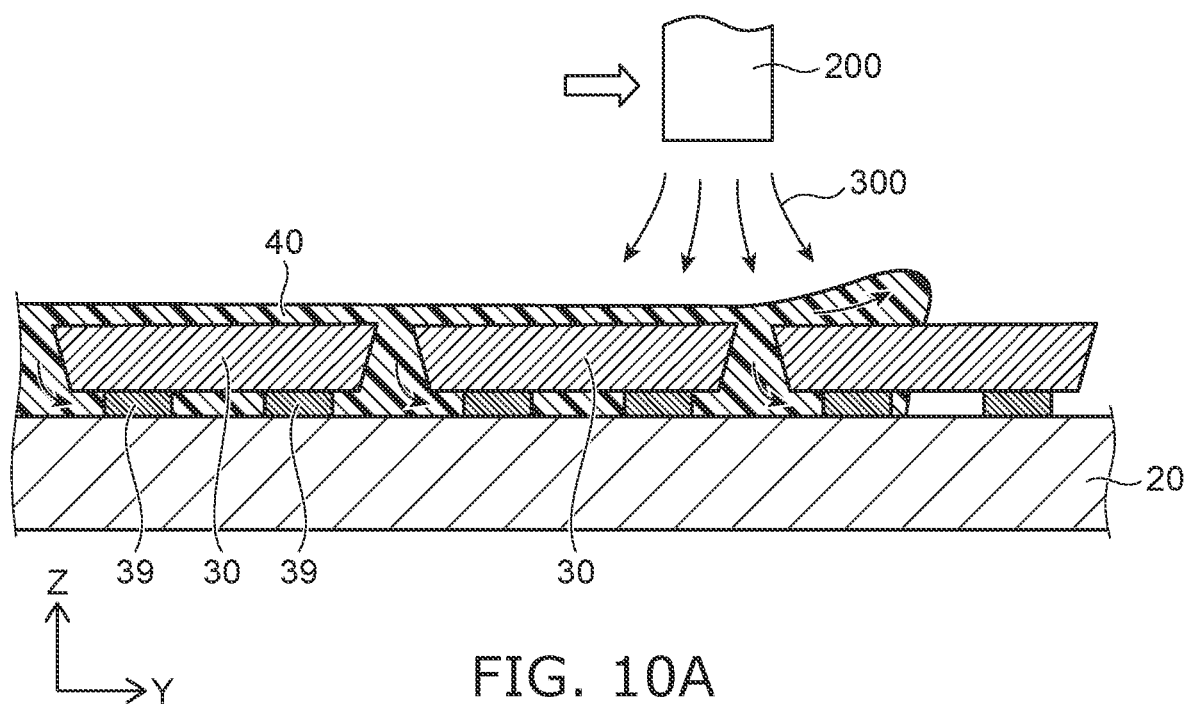
FIG. 10A is an enlarged cross-sectional view showing a method of manufacturing a light emitting module according to the embodiment.
Figure 10B:
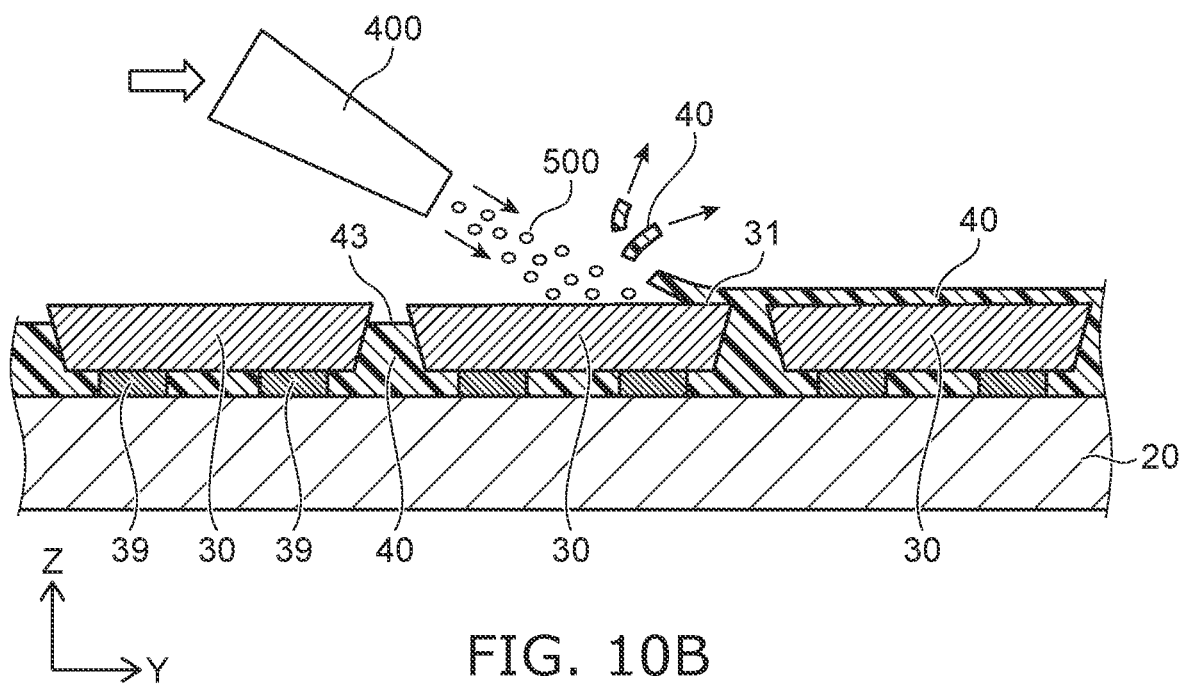
FIG. 10B is an enlarged cross-sectional view showing a method of manufacturing a light emitting module according to the embodiment.

FIG. 10A and FIG. 10B are enlarged cross-sectional views showing the method of manufacturing a light emitting module of the embodiment.

In FIG. 6A to FIG. 7C, a smaller number of light emitting elements 30 than actual are shown to simplify the drawings.

Step of Providing Wiring Board 20

Figure 6A:
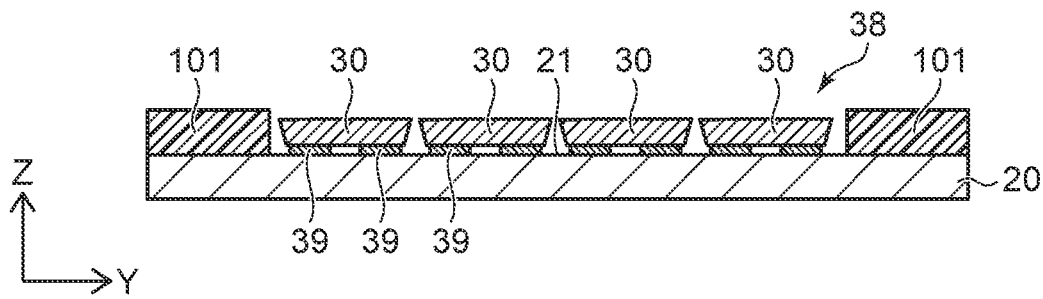
FIG. 6A is a cross-sectional view showing a method of manufacturing a light emitting module according to an embodiment.

As shown in FIG. 6A, a wiring board 20 is provided first. Then a plurality of light emitting elements 30 are mounted on the upper face 21 of the wiring board 20 in the central portion excluding the peripheral portion. The light emitting elements 30 are bonded to the wiring board 20 via a bonding material 39. A resist film 101 is disposed in the peripheral portion of the upper face 21 of the wiring board 20. The resist film 101 is disposed on the wiring board 20 to surround the region 38 in which the light emitting elements 30 are mounted. The resist film 101 is, for example, quadrangular frame shaped, and the thickness of the resist film 101 is set to be about the same as the sum of the thicknesses of the bonding material 39 and the light emitting elements 30. In this manner, a wiring board 20 having the upper face 21 on which a resist film 101 and light emitting elements 30 are disposed is provided.

Step of Disposing First Resin 40

Figure 6B:
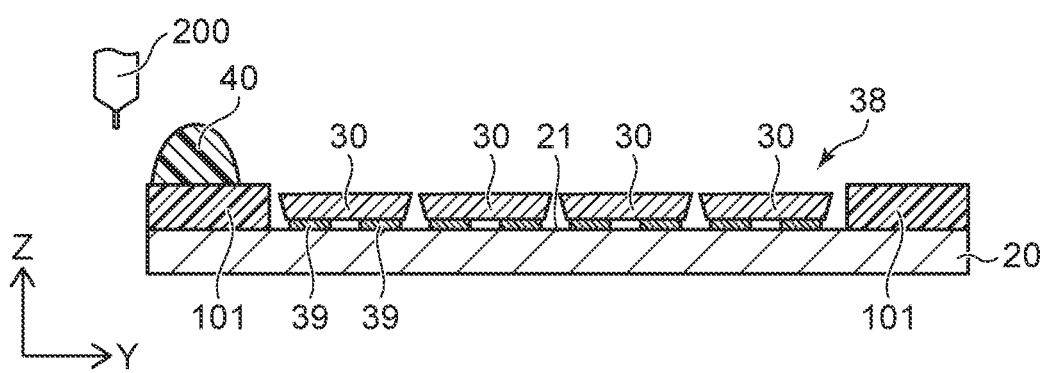
FIG. 6B is a cross-sectional view showing the method of manufacturing a light emitting module according to the embodiment.

As shown in FIG. 6B and FIG. 8A, an uncured first resin 40 is disposed in the area of the upper face 21 of the wiring board 20 outward from the region 38 in which the light emitting elements 30 are mounted. As described above, in the first resin 40, a light reflecting substance 42 is contained in the base material 41 formed of a light transmissive resin. For example, the region 38 is rectangular in a plan view, and the first resin 40 is disposed on the resist film 101 on one side of the region 38 in the Y direction along the long side of the region 38. The length of the first resin 40 disposed in the X direction is equal to or larger than the length L of the long sides of the region 38.

Here, as described above, the first resin 40 contains a high concentration of light reflecting substance. For this reason, the uncured first resin 40 disposed on the wiring board 20 hardly wet-spreads on the wiring board 20, and is likely to maintain the shape as placed on the surface. For example, the viscosity of the first resin 40 disposed on the upper face of the wiring board 20 is preferably 50 Pa·s or higher, but under 200 Pa·s at room temperature (20±5° C.). This can reduce unintended spreading of the first resin 40 into the region 38 when being disposed on the wiring board 20, thereby facilitating the control of movement of the first resin into the region 38 in the step of covering with the first resin 40 described below.

Step of Covering with First Resin 40

By spreading the uncured first resin 40 into the region 38, the first resin 40 is disposed between the wiring board 20 and the light emitting elements 30. At this point, the upper faces of the light emitting elements 30 are also covered with the first resin. The lateral faces of the light emitting elements 30 are covered with the first resin 40 as the first resin flows into the gaps between adjacent light emitting elements 30.

More specifically, as shown in FIG. 9, a nozzle 200 which has an opening having a width W is provided. The shape of the opening of the nozzle 200 (opening shape) is quadrangular and the width W is set to be equal to or larger than the length L of the long sides of the region 38.

Figure 6C:
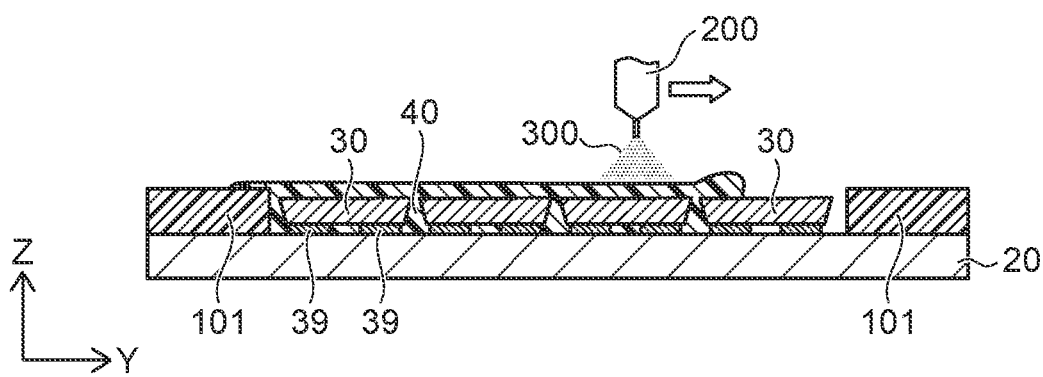
FIG. 6C is a cross-sectional view showing the method of manufacturing a light emitting module according to the embodiment.

Then, as shown in FIG. 6C and FIG. 10A, the nozzle 200 is moved in the Y direction, i.e., in the direction in which the short sides of the region 38 extend, while allowing the nozzle 200 to jet a gas 300 substantially perpendicularly to the upper face of the wiring board 20. Jetting the gas 300 against the upper face 21 of the wiring board 20 in this manner can spread the uncured first resin 40 along the Y direction. The movement of the nozzle 200 may be repeated multiple times, for example. This can spread the first resin 40 over the region 38 as shown in FIG. 8B.

At this time, the first resin 40 penetrates the gaps between adjacent light emitting elements 30 while moving on the upper faces 31 of the light emitting elements 30 in the Y direction, and further penetrates the gaps between the wiring board 20 and the light emitting elements 30. Slowly moving the nozzle 200 along one direction while allowing the nozzle 200 to jet a gas 300 substantially perpendicularly to the upper face of the wiring board 20 can reduce the generation of voids in the first resin 40 spread over the region 38.

In this embodiment, by jetting a gas 300 against the wiring board 20 substantially perpendicularly, the gas 300 substantially perpendicularly jetted can hit the first resin 40 along the upper face(s) of the resist film 101 and/or the wiring board 20. In this manner, the surface shape of the first resin 40 that has remained on the resist film 101 by the surface tension can be changed, more specifically, the contact angle formed by the first resin 40 and the upper face of the resist film 101 can be increased. This can reduce the wettability to gently spread the first resin in the Y direction. As the first resin 40 reaches the region 38 and comes into contact with the light emitting elements 30, the first resin 40 is allowed to wet-spread between the light emitting elements 30 and the gaps under the light emitting elements 30 by capillary action.

Spreading the first resin 40 in this manner can reduce the generation of voids. This can also reduce the thickness of the first resin 40 covering the upper faces of the light emitting elements 30, thereby facilitating the removal of the first resin 40 in the step of removing the first resin 40 described below. In this manner, the first resin 40 is disposed between the wiring board 20 and the light emitting elements 30 and between adjacent light emitting elements 30, and covers the upper faces 31 of the light emitting elements 30. Subsequently, the first resin 40 is hardened by treating with heat, for example. As one example, the thickness of the first resin 40 covering the upper faces of the light emitting elements 30 is about 20 μm. The upper faces of the light emitting elements 30 may be partially exposed from the first resin 40, but all outer edges of each upper face are preferably covered by the first resin 40.

In the step of covering with the first resin 40, the rate of moving the nozzle 200 in the Y direction that jets the air 300 is preferably in a range of 0.1 to 0.5 mm/sec., and is preferably set, for example, as 0.2 mm/sec. The gas pressure is preferably in a range of 0.3 to 0.5 MPa, and is preferably set as 0.45 MPa, for example. The movement of the nozzle 200 is preferably repeated 1 to 5 times, and is preferably set as three times, for example. The gas 300 is preferably air, nitrogen gas, or oxygen gas, and is set as air, for example.

Step of Removing First Resin 40

Figure 7A:
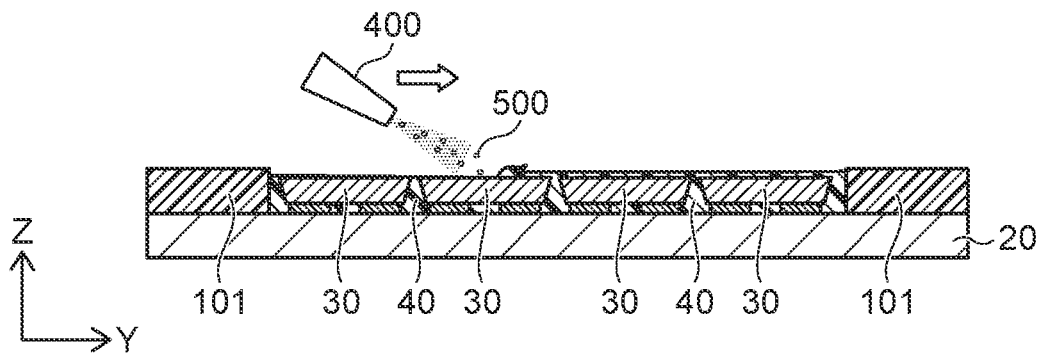
FIG. 7A is a cross-sectional view showing the method of manufacturing a light emitting module according to the embodiment.

Subsequently, as shown in FIG. 7A and FIG. 10B, a nozzle 400 is allowed to jet solid carbon dioxide 500 against the upper face of the first resin 40. The solid carbon dioxide 500 sublimates near the interfaces between the light emitting elements 30 and the first resin 40 to separate the first resin 40 from the upper faces 31 of the light emitting elements 30. This can remove the first resin 40 from the upper faces 31 of the light emitting elements 30. At this point, the upper portions of the first resin 40 disposed between the light emitting elements 30 can also be removed to expose the upper portions of the lateral faces 33 of the light emitting elements 30.

The particle size of the solid carbon dioxide 500 is preferably set as 5 to 50 μm. The rate of movement of the nozzle 400 is preferably in a range of 20 to 100 mm/sec., and is preferably set as 50 mm/sec., for example. The pressure applied in jetting the solid carbon dioxide 500 is preferably 0.1 to 0.35 MPa, and is preferably set as 0.3 MPa, for example. The movement of the nozzle 400 is preferably repeated 1 to 5 times, and may be three times, for example.

Figure 7B:
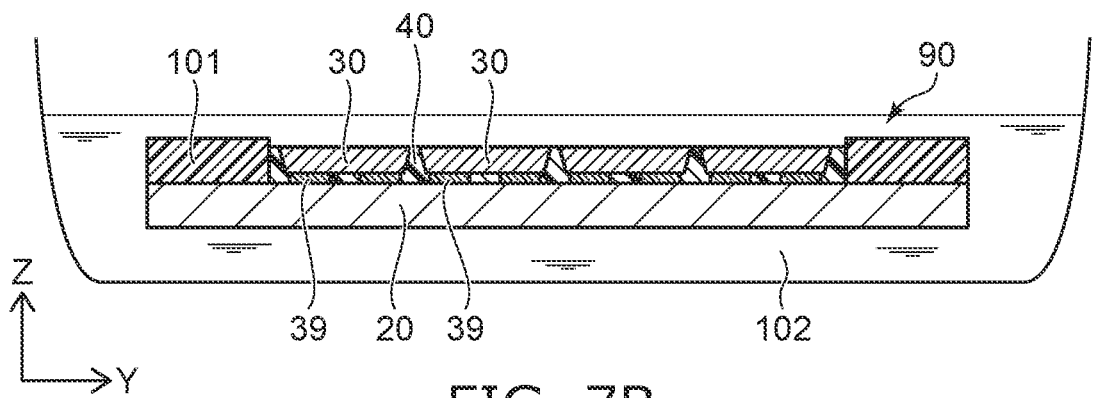
FIG. 7B is a cross-sectional view showing the method of manufacturing a light emitting module according to the embodiment.
Figure 7C:
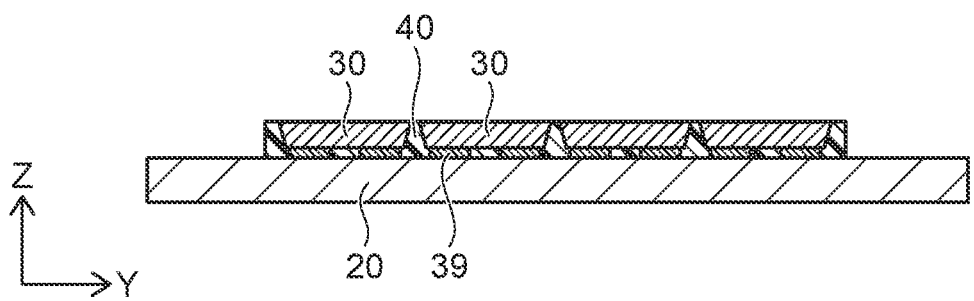
FIG. 7C is a cross-sectional view showing the method of manufacturing a light emitting module according to the embodiment.

Then the resist film 101 is removed. The resist film 101 can be removed, for example, by wet etching. As shown in FIG. 7B, the intermediate body 90 composed of the wiring board 20, the light emitting elements 30, the resist film 101, and the first resin 40 is dipped in the resist stripper 102. This can remove the resist film 101 as shown in FIG. 7C.

Step of Mounting Wiring Board 20

Subsequently, as shown in FIG. 1 and FIG. 4, the wiring board 20 is mounted on the package substrate 10. The package substrate 10 can be secured to the wiring board 20 via a known adhesive material, such as metal paste. An example of the adhesive material is silicone silver paste.

Step of Disposing Second Resin 50

Then an uncured or semi-cured second resin 50 is disposed on the light emitting elements 30 and the first resin 40. As described above, in the second resin 50, a phosphor 52 is contained in the base material 51. The second resin 50 is disposed inward of a frame-shaped third resin 70, i.e., in the region 38 in which the light emitting elements 30 are disposed. The second resin 50 may be disposed by spraying or potting, or by placing one that has been processed in the shape of a sheet.

Step of Hardening Second Resin 50

Then the second resin 50 is hardened by heating. At this time, heating the second resin 50 to a first temperature, for example, 100° C., the second resin 50 liquefies to penetrate the gaps between the light emitting elements 30 on the first resin 40. This allows the second resin 50 to come into contact with the upper portions of the lateral faces 33 of the light emitting elements 30. Then the second resin 50 is hardened by heating to a second, main hardening temperature which is higher than the first temperature such as 150° C. In the manner described above, a light emitting module 1 according to the embodiment can be manufactured.

The steps of disposing and hardening the second resin 50 may be performed between the step of stripping the resist film 101 shown in FIG. 7B and the step of mounting the wiring board 20 on the package substrate 10.

The method of manufacturing a light emitting module 1 according to the embodiment may further include, as a step of electrically connecting the wiring board 20 and the package substrate 10, a step of connecting the upper face pads 12 of the package substrate 10 and the external connection pad of the wiring board 20 using wires 60, as a step of protecting the wires 60, a step of disposing an outer resin frame 71 on the package substrate 10, an inner resin frame 71 on the wiring board 20, and a protective resin 73 between the outer resin frame 71 and the inner resin frame 72, and other steps.

In the light emitting module 1 according to this embodiment, a first resin 40 is disposed between the wiring board 20 and the light emitting elements 30. Accordingly, the light emitted downward from the light emitting elements 30 can be reflected upwards. Therefore, the light extraction efficiency of the light emitting module 1 is high.

The first resin 40 has a high light reflectance because of the high concentration of the light reflecting substance 42 in the first resin 40, i.e., 50 to 70% by mass. Therefore, the light extraction efficiency of the light emitting module 1 is high.

In the light emitting module 1, moreover, the second resin 50 is in contact with the light emitting elements 30, i.e., there is no adhesive layer or the like between the light emitting elements 30 and the second resin 50. Therefore, the light utilization is high.

In the light emitting module 1, furthermore, the upper portions of the lateral faces 33 of the light emitting elements 30 are in contact with the second resin 50. Exposing the upper portions of the lateral faces 33 of the light emitting elements 30 from the first resin 40 can increase the efficiency in extracting light from the light emitting elements 30. Moreover, the contact areas between the light emitting elements 30 and the second resin 50 is large, thereby being able to achieve good adhesion.

According to the method of manufacturing a light emitting module 1 of this embodiment, the first resin 40 can be securely disposed between the wiring board 20 and the light emitting elements 30, and between the light emitting elements 30 by jetting a gas against the upper face of the wiring board 20 on which the first resin 40 is disposed while reducing the generation of voids. This makes it possible to dispose a first resin 40 containing a high concentration of a light reflecting substance between narrower gaps between the light emitting elements 30, thereby facilitating the size reduction in the light emitting module 1. Furthermore, the reflectance of the first resin 40 can be increased.

Moreover, as shown in FIG. 9, the width W of the opening of the nozzle 200 is set to be equal to or larger than the length L of the long sides of the region 38. This can move the first resin 40 across the region 38 in one pass in the transverse direction, thereby efficiently and uniformly spreading the first resin 40 while reducing the generation of voids.

Repeating the movement of the nozzle 200 multiple times can reduce the thickness of the first resin 40 disposed on the upper faces 31 of the light emitting elements 30. This allows the solid carbon dioxide jetted against the surface to remove the first resin 40 from the upper faces 31 of the light emitting elements 30. Because solid carbon dioxide is soft, it is less likely to damages the light emitting elements 30. Allowing the solid carbon dioxide to sublimate near the interfaces between the light emitting elements 30 and the first resin 40 can easily remove the first resin 40. Furthermore, jetting solid carbon dioxide against the surface can also remove the upper portions of the first resin 40 located between the light emitting elements 30, thereby exposing the upper portions of the lateral faces 33 of the light emitting elements 30.

The embodiments described in the foregoing are examples that give shape to the present invention, and the present invention is not limited to these embodiments. For example, those resulting from adding to, removing from, or modifying certain constituent elements or steps in the embodiments described above are also encompassed by the present invention.

The present disclosure can be utilized in automotive headlights, light sources for display devices, and the like.

What is claimed is:

1. A method of manufacturing a light emitting module, the method comprising:
    providing a wiring board having an upper face on which a plurality of light emitting elements are mounted;
    disposing a first resin in an area of the upper face of the wiring board that is outward of a region in which the light emitting elements are mounted, wherein the first resin contains a light reflecting substance; and
    covering lateral faces of the light emitting elements with the first resin by spreading the first resin over the region in which the light emitting elements are mounted; s wherein:
    in a plan view, the region in which the light emitting elements are mounted is rectangular; and
    in the step of disposing the first resin, the first resin is disposed along a long side of the region in which the light emitting elements are mounted.

2. The method of manufacturing a light emitting module according to claim 1, wherein the step of covering with the first resin comprises spreading the first resin by jetting a gas against the upper face of the wiring board.

3. The method of manufacturing a light emitting module according to claim 2, wherein, in the step of covering the lateral faces of the light emitting elements with the first resin, the gas is jetted perpendicularly to the upper face of the wiring board.

4. The method of manufacturing a light emitting module according to claim 1, wherein:
    the step of covering the lateral faces of the light emitting elements with the first resin comprises moving a nozzle in a direction in which a short side of the region extends while allowing the nozzle to jet the gas; and
    the nozzle has an opening with a length equal to or greater than a length of the long side of the region in which the light emitting elements are mounted.

5. The method of manufacturing a light emitting module according to claim 4, wherein, in the step of covering the lateral faces of the light emitting element with the first resin, the step of moving the nozzle is repeated multiple times.

6. The method of manufacturing a light emitting module according to claim 1, wherein:
    the step of covering the lateral faces of the light emitting element with the first resin comprises covering upper faces of the light emitting elements with the first resin; and
    the method further comprises, subsequent to the step of covering the lateral faces of the light emitting element with the first resin, removing the first resin from the upper faces of the light emitting elements by jetting solid carbon dioxide against an upper face of the first resin.

7. The method of manufacturing a light emitting module according to claim 6, wherein, in the step of removing the first resin from the upper faces of the light emitting elements, an upper portion of the first resin disposed between the light emitting elements is also removed.

8. The method of manufacturing a light emitting module according to claim 1, wherein a concentration of the light reflecting substance in the first resin is in a range of 50% to 70% by mass.

9. The method of manufacturing a light emitting module according to claim 1, wherein a distance between adjacent ones of the light emitting elements is in a range of 2 μm to 10 μm.

10. The method of manufacturing a light emitting module according to claim 1 further comprising:
    disposing a second resin on the light emitting elements and on the first resin, wherein the second resin is uncured and contains a phosphor; and
    hardening the second resin.

* * * * *

UNITED STATES PATENT AND TRADEMARK OFFICE
CERTIFICATE OF CORRECTION

PATENT NO. : 12,317,661 B2
APPLICATION NO. : 17/702245
DATED : May 27, 2025
INVENTOR(S) : Koji Abe and Kazusa Nishiuchi It is certified that error appears in the above-identified patent and that said Letters Patent is hereby corrected as shown below:

In the Claims

Claim 1, Column 11, Line 23:
Please delete:
"in which the light emitting elements are mounted; s"
Please replace with:
"in which the light emitting elements are mounted;"

Signed and Sealed this
Twelfth Day of August, 2025

Coke Morgan Stewart
*Acting Director of the United States Patent and Trademark Office*